(12) United States Patent
Nguyen (10) Patent No.: US 6,177,819 B1
(45) Date of Patent: Jan. 23, 2001

(54) INTEGRATED CIRCUIT DRIVER WITH ADJUSTABLE TRIP POINT

(75) Inventor: Andy T. Nguyen, San Jose, CA (US)

(73) Assignee: Xilinx, Inc., San Jose, CA (US)

(*) Notice: Under 35 U.S.C. 154(b), the term of this patent shall be extended for 0 days.

(21) Appl. No.: 09/283,457

(22) Filed: Apr. 1, 1999

(51) Int. Cl.$^7$ .................................................. H03K 17/16

(52) U.S. Cl. .......................... 327/112; 327/170; 327/108; 327/437; 326/87; 326/27

(58) Field of Search ..................................... 327/108, 112, 327/437, 170; 326/33, 82, 85, 87, 91

(56) References Cited

U.S. PATENT DOCUMENTS

| | | | |
|---|---|---|---|
| 4,612,466 | * | 9/1986 | Stewart ................................. 327/437 |
| 5,894,238 | * | 4/1999 | Chien ..................................... 327/112 |

OTHER PUBLICATIONS

"The Programmable Logic Data Book", copyright 1998, available from Xilinx, Inc. at 2100 Logic Drive, San Jose, California 95124, pp. 4–5 to 4–69.

\* cited by examiner

*Primary Examiner*—Dinh T. Le
(74) *Attorney, Agent, or Firm*—Lois D. Cartier (57) ABSTRACT

The invention provides an IC driver circuit having an adjustable trip point. The driver circuit automatically adjusts the trip point of the circuit based on the state of the output signal (and thus, by inference, on the state of the input signal), by using first and second switches to couple and decouple secondary pullup and pulldown circuits. In one embodiment, this coupling/decoupling also ensures that the output signal has a shorter rise/fall time than the input signal. Therefore, the output signal reaches a midpoint voltage level (i.e., VCC/2) before the input signal reaches the same level. In a sense, the driver circuit has a negative propagation delay. In a second embodiment, the first and second switches are controlled to ensure low noise-sensitivity, rather than high speed. In another embodiment, the driver circuit can be controlled for either high speed or noise insensitivity.

38 Claims, 9 Drawing Sheets

INTEGRATED CIRCUIT DRIVER WITH ADJUSTABLE TRIP POINT

FIELD OF THE INVENTION

The invention relates to integrated circuits (ICs). More particularly, the invention relates to a driver circuit for an IC.

BACKGROUND OF THE INVENTION

In integrated circuits, signals are often transmitted on signal lines for relatively long distances across the IC. The resulting resistance and capacitive loading introduces delay to the signal. For some heavily loaded signal lines, the delay is crucial to the function of the circuit. Therefore, such lines are often buffered, i.e., driver circuits are provided that accept an input signal at an input terminal and mirror the input signal as an output signal on an output terminal, with increased drive capability. Available driver circuits, however, impose a delay between the input and output signals that must be taken into account when designing ICs. Therefore, while the overall path delay can be reduced by using a driver circuit, the path delay cannot be reduced beyond the delay through the driver circuit.

In field programmable gate arrays (FPGAS), general interconnect lines are provided that can be programmed to be used for many different functions. (One such FPGA, the Xilinx XC4000™ Series FPGA, is described in detail in pages 4–5 through 4–69 of the Xilinx 1998 Data Book entitled "The Programmable Logic Data Book 1998" (hereinafter referred to as "the Xilinx Data Book"), published in 1998 and available from Xilinx, Inc., 2100 Logic Drive, San Jose, Calif. 95124, which pages are incorporated herein by reference. Xilinx, Inc., owner of the copyright, has no objection to copying these and other pages referenced herein but otherwise reserves all copyright rights whatsoever.) The signals on these general interconnect lines may have a high or low fanout, and may be of greater or lesser importance in determining the operating frequency of the design. Therefore, the need for buffering on such lines is difficult to predict. As a consequence, the longer general interconnect lines are usually buffered at all times in order to accommodate the worse case scenario. A signal traversing a large number of these buffers (i.e., a signal routed on a succession of programmably coupled general interconnect lines) incurs more delay than a signal traversing a smaller number of buffers. Therefore, the two signals are "skewed" relative to one another. This skew considerably complicates the task of implementing time-critical circuits in FPGAs.

Therefore, it is desirable to provide a buffer having a zero delay, so that a difference in the number of buffers traversed does not introduce skew between two signals. It is further desirable to provide an IC driver circuit having a negative delay, to compensate for delays in logic circuits on a signal path. It is yet further desirable to provide an IC driver circuit having an adjustable delay, so that delays in different paths can be adjusted to minimize skew.

It is also desirable to provide an IC driver circuit having a low noise sensitivity, and further to provide an IC driver circuit that it is programmably either high-speed (low delay) or noise-insensitive.

SUMMARY OF THE INVENTION

The invention provides an IC driver circuit having an adjustable trip point. A control circuit adjusts the trip point of the driver circuit during operation based on the state of the output signal, thereby providing higher speed and/or lower noise sensitivity.

A first embodiment of the driver circuit comprises an input terminal, an output terminal, a control circuit, two switch circuits, two pullup circuits, two pulldown circuits, and a delay element. The output terminal is coupled to each pullup and pulldown circuit. The input terminal is coupled to the first pullup circuit and through the first switch circuit to the second pullup circuit. The input terminal is also coupled to the first pulldown circuit and through the second switch circuit to the second pulldown circuit. The control circuit controls the switch circuits to either couple or decouple the input terminal from the second pullup and pulldown circuits, depending on the previous state of an output signal on the output terminal. The previous state of the output signal is determined by coupling the output signal to the control circuit through the delay element. In some embodiments the delay element is omitted, because the control circuit itself supplies sufficient delay on the output signal.

The driver circuit automatically adjusts the trip point of the circuit based on the state of the output signal (and thus, by inference, on the state of the input signal), by coupling and decoupling the second pullup and pulldown circuits from the input terminal using the first and second switches. This coupling/decoupling also ensures that the output signal has a shorter rise/fall time than the input signal. In one embodiment, the output signal reaches a midpoint voltage level (i.e., VCC/2) at the same time that the input signal reaches the same level, thereby providing a zero delay through the driver circuit. In another embodiment, the output signal reaches the midpoint voltage level before the input signal does so. In this embodiment, the driver circuit has, in effect, a negative propagation delay.

In a second embodiment, the first and second switches are controlled to ensure low noise sensitivity, rather than high speed. Therefore, the driver circuit acts as a Schmitt trigger.

In a third embodiment, the control circuit further comprises one or more control input terminals. Control signals received on these terminals determine which of two or more operating modes is followed by the control circuit. These modes may include, for example, a high-speed mode (as in the first embodiment) and a noise-insensitive mode (as in the second embodiment).

In other embodiments of the invention, the first switch circuit is disposed between the output terminal and the second pullup, while the second switch circuit is disposed between the output terminal and the second pulldown.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

Several embodiments of IC driver circuits according to the invention are described. In the following description, numerous specific details are set forth to provide a more thorough understanding of the present invention. However, it will be apparent to one skilled in the art that the present invention may be practiced without these specific details.

First Embodiment

Figure 1:
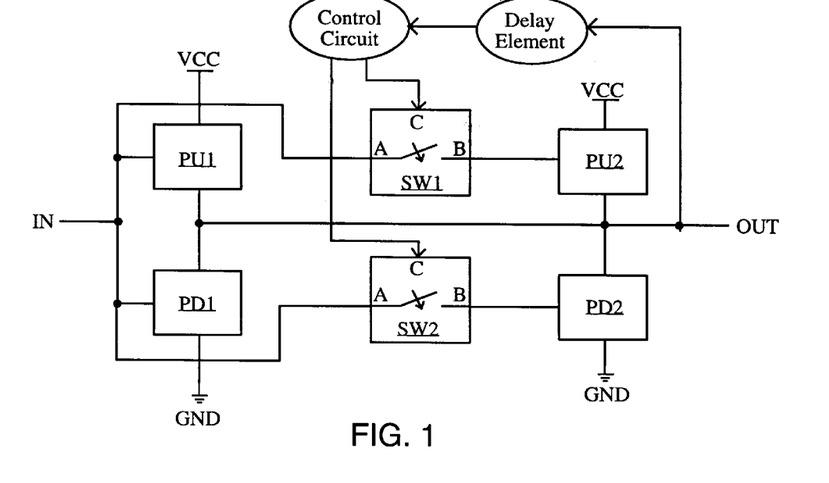
FIG. 1 shows a circuit block diagram for an IC driver circuit according to one embodiment of the invention.

FIG. 1 shows a driver circuit according to a first embodiment of the present invention. The driver circuit of this embodiment comprises an input terminal IN, an output terminal OUT, a control circuit 101, two switch circuits (SW1, SW2), two pullup circuits (PU1, PU2), two pulldown circuits (PD1, PD2), and a delay element 102. Each pullup and pulldown circuit has source, drain, and control terminals. The source terminal of each pullup circuit is coupled to the power high voltage level (VCC). The source terminal of each pulldown circuit PD1, PD2 is coupled to the power low voltage level (in this embodiment, ground or GND). Output terminal OUT is coupled to the drain terminal of each pullup and pulldown circuit. Input terminal IN is coupled to the control terminal of first pullup circuit PU1 and through first switch circuit SW1 to the control terminal of second pullup circuit PU2. Input terminal IN is also coupled to the control terminal of first pulldown circuit PD1 and through second switch circuit SW2 to the control terminal of second pulldown circuit PD2.

Control circuit 101 is coupled to a control terminal C of each switch circuit SW1, SW2. Control circuit 101 controls switch circuits SW1, SW2 to either couple or decouple input terminal IN from second pullup and pulldown circuits PU2, PD2, respectively. Control circuit 101 is itself controlled by an output signal on output terminal OUT, which feeds back to control circuit 101 through delay element 102.

In some embodiments, the driver circuit of FIG. 1 is used as a high-speed driver. In these embodiments, first switch SW1 is controlled to couple input terminal IN to the control terminal of pullup circuit PU2 when the signal on output terminal OUT ("signal OUT") is low, and also during a low-to-high transition of signal OUT. Shortly after signal OUT goes high, first switch SW1 decouples input terminal IN from pullup circuit PU2. Similarly, second switch SW2 is controlled to couple input terminal IN to the control terminal of pulldown circuit PD2 when signal OUT is high, and also during a high-to-low transition of signal OUT. Shortly after signal OUT goes low, second switch SW2 decouples input terminal IN from pulldown circuit PD2.

Figure 1A:
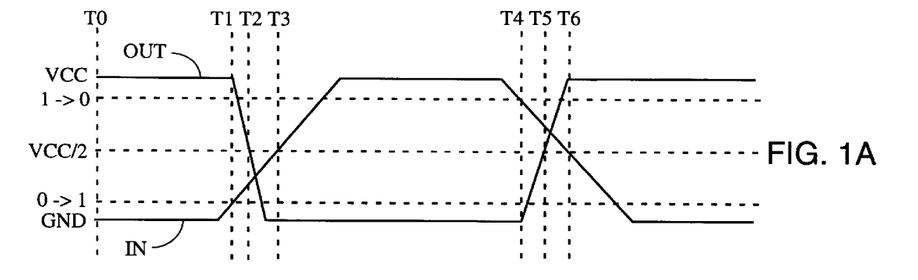
FIG. 1A shows a timing diagram for a high-speed IC driver circuit as in FIG. 1.
Figure 1B:
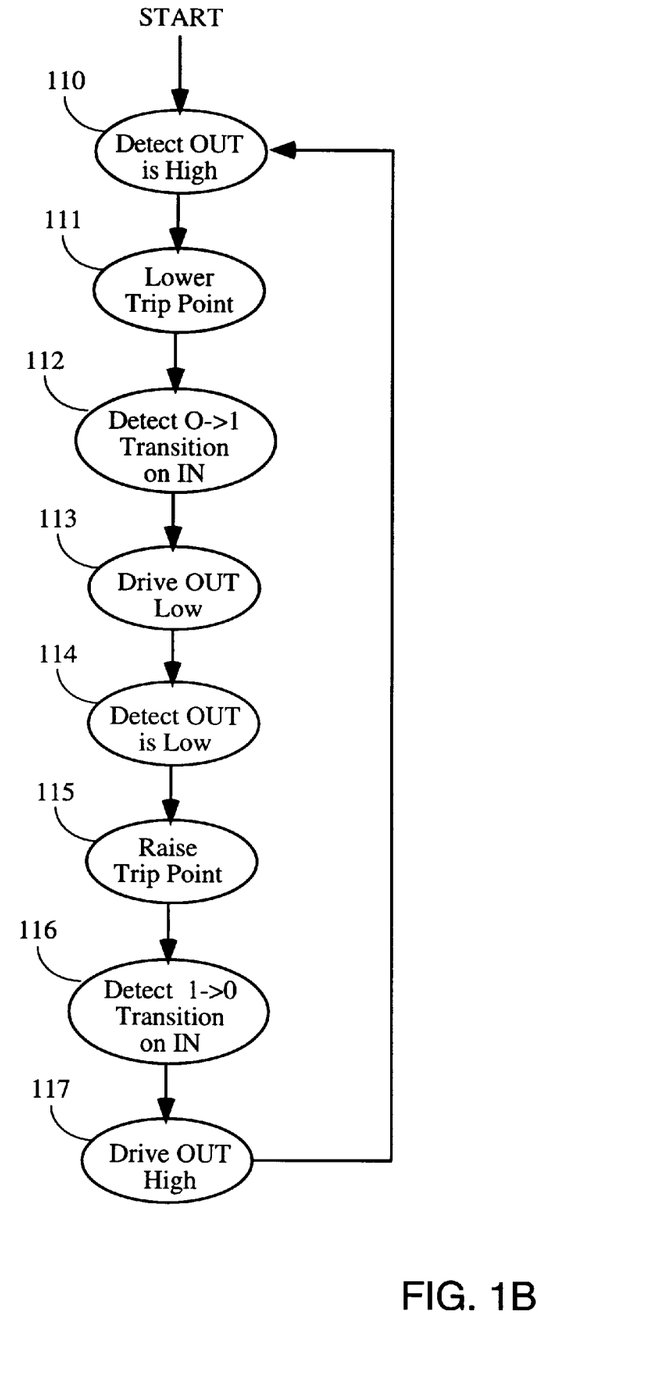
FIG. 1B shows a flow diagram for the high-speed IC driver circuit of FIGS. 1 and 1A.

The timing diagram of FIG. 1A shows the behavior of the driver circuit of FIG. 1 in the high-speed embodiments. The flow diagram of FIG. 1B shows a corresponding flow for the high-speed driver circuit. At time T0 (FIG. 1A), the signal at input terminal IN ("signal IN") is low and signal OUT is high. Signal OUT is fed back through delay element 102 to disable switch SW1 (i.e., to decouple input terminal IN from pullup circuit PU2) and to enable switch SW2 (i.e., to couple input terminal IN to pulldown circuit PD2). This feedback loop corresponds to step 110 in FIG. 1B. The enablement of pulldown circuit PD2 lowers the trip point of the driver circuit, since the pulldown network (PD1, PD2) is now much stronger than the pullup network (PU1 only). (The term "trip point" is used herein to indicate the voltage level on a transitioning signal on the input terminal that triggers the driver circuit to react by starting to change the voltage at the output terminal.) The new trip point is called the low-to-high trip point, and this voltage level is labeled as "0→1" in FIG. 1A. The decoupling of pullup circuit PU2 and the coupling of pulldown circuit PD2 correspond to step 111 of FIG. 1B.

When signal IN crosses the low-to-high trip point (0→1) for the driver circuit at time T1 (FIG. 1A), the input transition is detected (step 112 of FIG. 1B) and signal OUT begins the transition from high to low (step 113). The driver circuit has extra pulldown strength because of pulldown circuit PD2. Therefore, signal OUT transitions very quickly from high to low, reaching the midpoint voltage VCC/2 at time T2. Signal IN, which is transitioning relatively slowly, reaches the midpoint voltage VCC/2 at time T3, after time T2. Therefore, the driver circuit has a negative delay, if delay is measured using the midpoint voltage level.

After a delay imposed by delay element 102 (FIG. 1), the low value on signal OUT is detected (step 114 of FIG. 1B). Pulldown circuit PD2 is decoupled from input terminal IN, and pullup circuit PU2 is coupled to input terminal IN (step 115) to await the high-to-low transition on signal IN. The enablement of pullup circuit PU2 raises the trip point of the driver circuit, since the pullup network (PU1, PU2) is now much stronger than the pulldown network (PD1 only). The new trip point is called the high-to-low trip point, and this voltage level is labeled as "1→0" in FIG. 1A. When signal IN crosses the high-to-low trip point (1→0) for the driver circuit at time T4 (FIG. 1A), the input transition is detected (step 116) and signal OUT begins the transition from low to high (step 117). The driver circuit has extra pullup strength because of pullup circuit PU2. Therefore, signal OUT transitions very quickly from low to high, reaching the midpoint voltage VCC/2 at time T5. Signal IN, which is transitioning relatively slowly, reaches the midpoint voltage VCC/2 at time T6, after time T5. Therefore, the driver circuit also displays a negative delay on the high-to-low input transition, if delay is measured using the midpoint voltage level. After a delay imposed by delay element 102 (FIG. 1), the high value on signal OUT is detected (returning to step 110 in FIG. 1B). Pullup circuit PU2 is again decoupled from input terminal IN, and pulldown circuit PD2 is coupled to input terminal IN (step 111) to await the low-to-high transition on signal IN.

In effect, the high-speed driver circuit of FIGS. 1, 1A, and 1B behaves as a "smart driver", which effectively "deduces" the next transition at the input terminal (based on the voltage level at the output terminal) and sets the trip point appropriately to minimize the response time of the driver circuit.

In other embodiments, the driver circuit of FIG. 1 is used as a noise-insensitive driver. In these embodiments, second switch SW2 is controlled to couple input terminal IN to the control terminal of pulldown circuit PD2 when signal OUT is low, and also during a low-to-high transition of signal OUT. Shortly after signal OUT goes high, second switch SW2 decouples input terminal IN from pulldown circuit PD2. Similarly, first switch SW1 is controlled to couple input terminal IN to the control terminal of pullup circuit PU2 when the signal on output terminal OUT ("signal OUT") is high, and also during a high-to-low transition of signal OUT. Shortly after signal OUT goes low, first switch SW1 decouples input terminal IN from pullup circuit PU2.

Figure 1C:
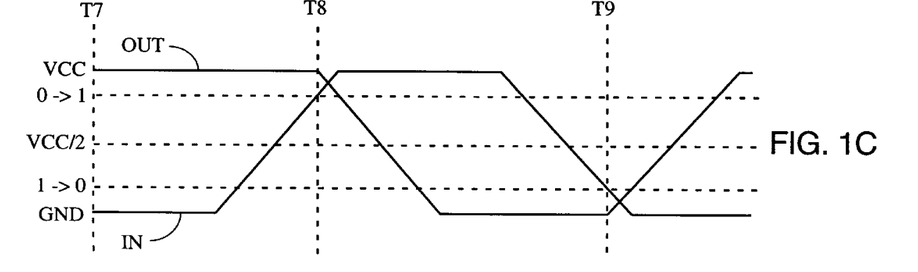
FIG. 1C shows a timing diagram of a noise-insensitive IC driver circuit as in FIG. 1.
Figure 1D:
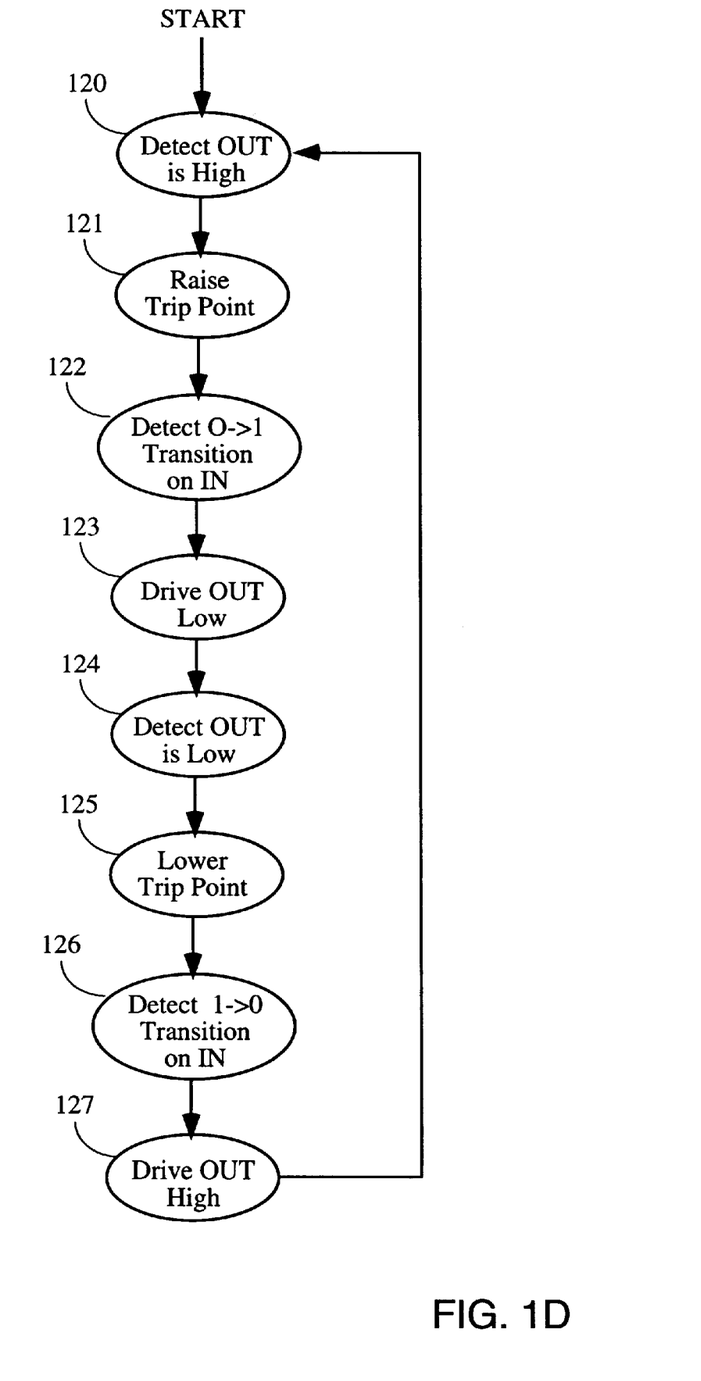
FIG. 1D shows a flow diagram for the noise-insensitive IC driver circuit of FIGS. 1 and 1C.

The timing diagram of FIG. 1C shows the behavior of the driver circuit of FIG. 1 in the noise-insensitive embodiments. The flow diagram of FIG. 1D shows a corresponding flow for the high-speed driver circuit. At time T7 (FIG. 1C), signal IN is low and signal OUT is high. Signal OUT is fed back through delay element 102 to enable switch SW1 and to disable switch SW2. This feedback loop corresponds to step 120 in FIG. 1D. The enablement of pullup circuit PU2 raises the trip point of the driver circuit to the new low-to-high trip point (labeled "0→1" in FIG. 1C), since the pullup network (PU1, PU2) is now much stronger than the pulldown network (PD1 only). Note that the new low-to-high trip point is much higher than that of the high-speed embodiment of FIG. 1A. Any noise on signal IN that does not reach the new low-to-high trip point is ignored. The coupling of pullup circuit PU2 and the decoupling of pulldown circuit PD2 correspond to step 121 of FIG. 1D.

When signal IN crosses the low-to-high trip point (0→1) for the driver circuit at time T8 (FIG. 1C), the input transition is detected (step 122 of FIG. 1D) and signal OUT begins the transition from high to low (step 123). When signal OUT is low, and after a delay imposed by delay element 102 (FIG. 1), the low value on signal OUT is detected (step 124 of FIG. 1D). Pullup circuit PU2 is decoupled from input terminal IN, and pulldown circuit PD2 is coupled to input terminal IN (step 125) to await the high-to-low transition on signal IN. The enablement of pulldown circuit PD2 lowers the trip point of the driver circuit to the new high-to-low trip point (labeled "1→0" in FIG. 1C), since the pulldown network (PD1, PD2) is now much stronger than the pullup network (PU1 only). Note that the new high-to-low trip point is much lower than that of the high-speed embodiment of FIG. 1A. Any noise on signal IN that does not reach the new high-to-low trip point is ignored. When signal IN crosses the high-to-low trip point (1→0) for the driver circuit at time T9 (FIG. 1C), the input transition is detected (step 126) and signal OUT begins the transition from low to high (step 127). After a delay imposed by delay element 102 (FIG. 1), the high value on signal OUT is detected (returning to step 120). Pulldown circuit PD2 is again decoupled from input terminal IN, and pullup circuit PU2 is coupled to input terminal IN (step 121) to await the low-to-high transition on signal IN.

In the noise-insensitive embodiment of FIGS. 1, 1C, and 1D, the driver circuit of FIG. 1 effectively "deduces" the next transition at the input terminal (based on the voltage level at the output terminal) and sets the trip point appropriately to minimize the sensitivity of the driver circuit to noise on the input signal.

Figures 2, 3, 3A:
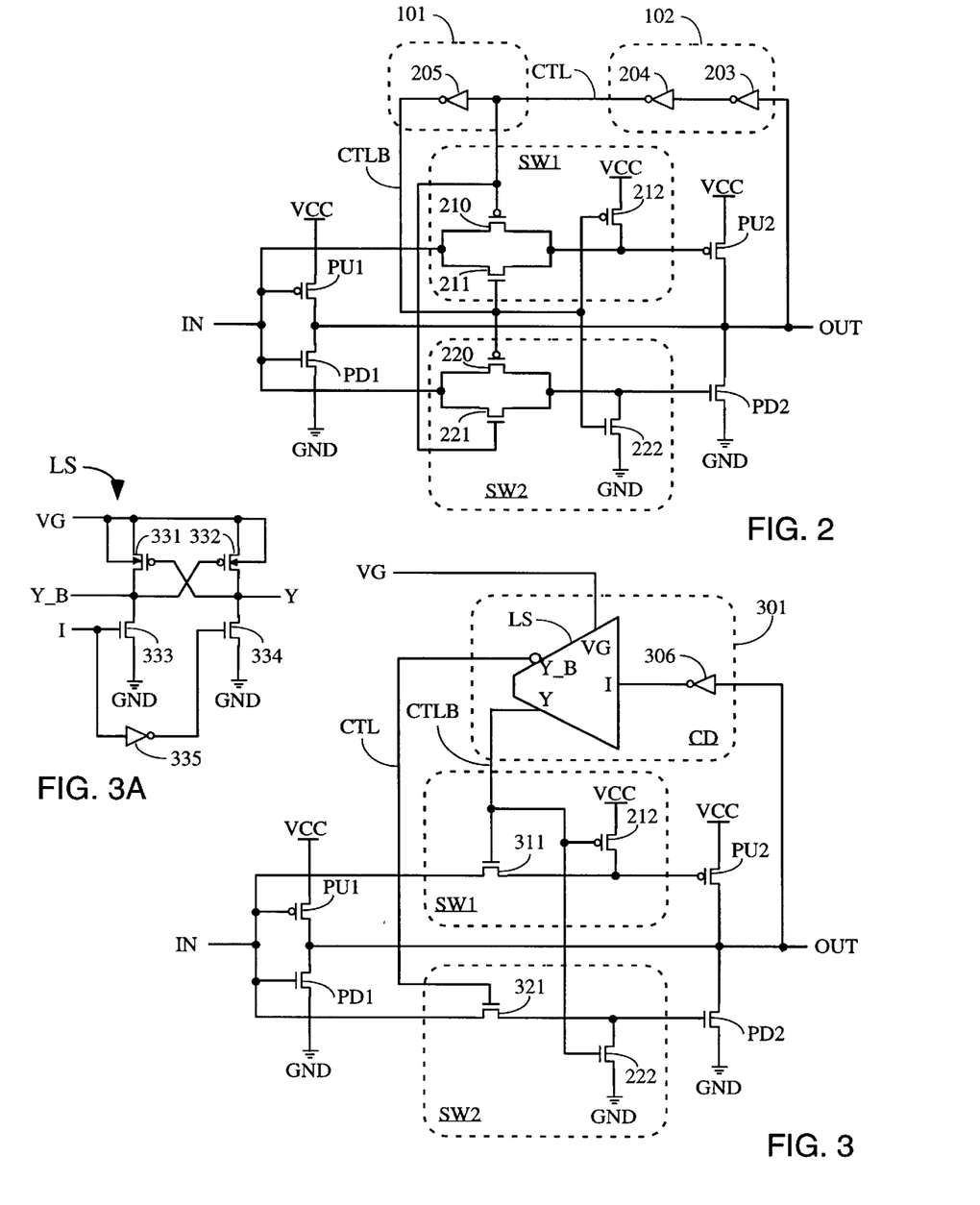
FIG. 2 shows a schematic diagram of a high-speed IC driver circuit with CMOS switches implementing the circuit of FIG. 1.
FIG. 3 shows a schematic diagram of a high-speed IC driver circuit with NMOS switches also implementing the circuit of FIG. 1.
FIG. 3A shows a schematic diagram of a level shifter used in the embodiment of FIG. 3.

FIG. 2 shows a first implementation of the high-speed driver circuit of FIGS. 1 and 1A. In the circuit of FIG. 2, pullup circuits PU1, PU2 are each implemented as a single P-channel transistor. Similarly, pulldown circuits PD1, PD2 are each implemented as a single N-channel transistor. Switch circuit SW1 comprises a P-channel pass-gate 210 and an N-channel pass-gate 211 coupled in parallel, and a pullup 212 that pulls the control terminal of pullup circuit PU2 high (i.e., disables pullup circuit PU2) when switch circuit SW1 is disabled. This "initialization" feature of switch circuit SW1 prevents the gate of pullup circuit PU2 from floating when the switch is disabled. Similarly, switch circuit SW2 comprises a P-channel pass-gate 220 and an N-channel pass-gate 221 coupled in parallel, and a pulldown 222 that pulls the control terminal of pulldown circuit PD2 low (i.e., disables pulldown circuit PD2) when switch SW2 is disabled.

In this implementation, delay element 102 comprises two inverters 203 and 204 coupled in series between output terminal OUT and control signal CTL. Control circuit 101 comprises feedback paths from control signal CTL to the gate of P-channel transistor 210, and to the gate of N-channel transistor 221. Control circuit 101 further comprises an inverter 205 driven by control signal CTL and providing inverted control signal CTLB. Inverted control signal CTLB drives the gates of N-channel transistor 211, P-channel transistor 220, pullup 212, and pulldown 222.

FIG. 3 shows a second implementation of the high-speed driver circuit of FIGS. 1 and 1A. In FIG. 3, pullup circuits PU1, PU2 and pulldown circuits PD1, PD2 are implemented as in FIG. 2. Switch circuit SW1 comprises an N-channel pass-gate 311 and a pullup 212 as in FIG. 2. Similarly, switch circuit SW2 comprises an N-channel transistor 321 and a pulldown 222 as in FIG. 2. (N-channel transistors are used to implement switch circuits SW1, SW2 in this embodiment because of the savings in silicon area. A P-channel transistor must be larger than an N-channel transistor to provide the same speed.) Control circuit 101 and delay element 102 are combined into a single control/delay circuit 301, which comprises an inverter 306 (driven by output terminal OUT) and a level shifter LS. Level shifter LS has an input terminal I driven by inverter 306, a substrate voltage terminal VG driven from outside the driver circuit, and two output terminals Y and Y_B. Level shifter output terminal Y (CTLB) is coupled to the gates of N-channel transistors 311, 222 and P-channel transistor 212. Level shifter output terminal Y_B (CTL) is coupled to the gate of N-channel transistor 321. Level shifter LS both acts as a delay element and provides "pumped" outputs, i.e., the output signals at terminals Y and Y_B are generally at a higher voltage level than VCC (depending on the voltage level on terminal VG). This higher output voltage is desirable to prevent a voltage drop as input signal IN passes through N-channel transistors 311 and 321.

FIG. 3A is a schematic diagram for one implementation of level shifter LS, which comprises two P-channel transistors 331, 332, two N-channel transistors 333, 334, and an inverter 335. P-channel transistor 331 is coupled between substrate voltage terminal VG and output terminal Y_B, is gated by output terminal Y, and has a substrate voltage coupled to substrate voltage terminal VG. Similarly, P-channel transistor 332 is coupled between substrate voltage terminal VG and output terminal Y, is gated by output terminal Y_B, and has a substrate voltage coupled to substrate voltage terminal VG. N-channel transistor 333 is coupled between output terminal Y_B and ground GND. N-channel transistor 334 is coupled between output terminal Y and ground GND. Input terminal I drives the gate of N-channel transistor 333, and also drives inverter 335. Inverter 335 drives the gate of N-channel transistor 334.

Figure 4:
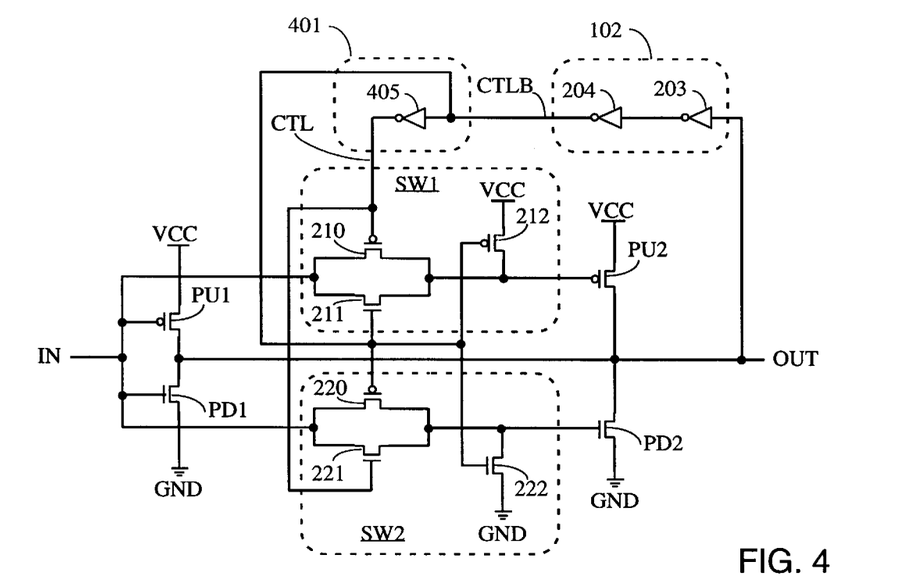
FIG. 4 shows a schematic diagram of a noise-insensitive IC driver circuit with CMOS switches also implementing the circuit of FIG. 1.

FIG. 4 shows a first implementation of the noise-insensitive driver circuit of FIGS. 1 and 1B. The circuit of FIG. 4 is similar to the high-speed driver circuit of FIG. 2, except for control circuit 401. Control circuit 401 comprises feedback paths from inverted control signal CTLB (provided by delay element 102) to the gates of N-channel transistor 211, P-channel transistor 220, pullup 212, and pulldown 222. Control circuit 401 further comprises an inverter 405 driven by inverted control signal CTLB and providing control signal CTL. Control signal CTL drives the gates of P-channel transistor 210 and N-channel transistor 221.

Figure 5:
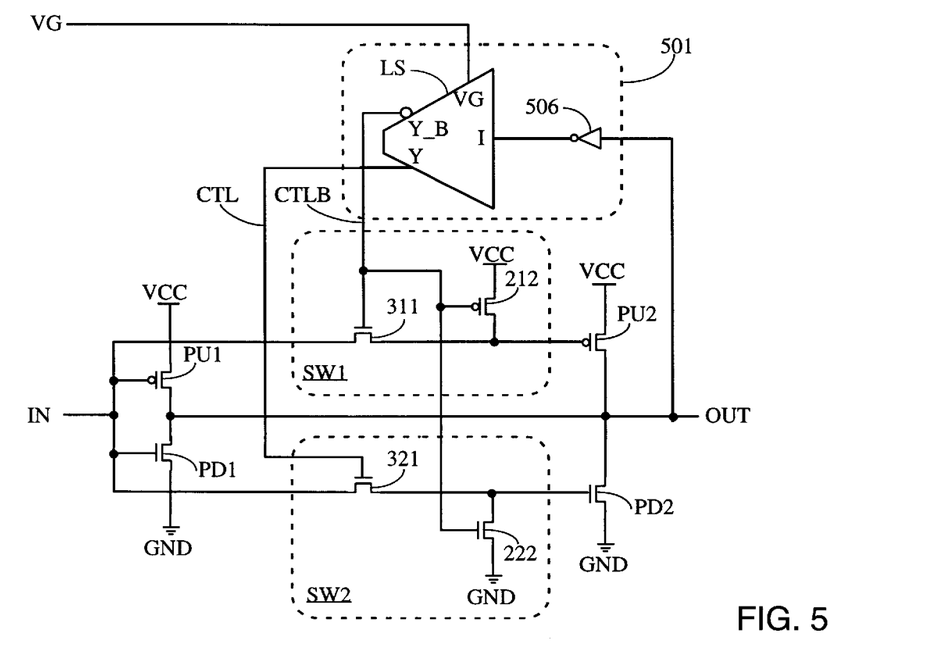
FIG. 5 shows a schematic diagram of a noise-insensitive IC driver circuit with NMOS switches also implementing the circuit of FIG. 1.

FIG. 5 shows a second implementation of the noise-insensitive driver circuit of FIGS. 1 and 1B. FIG. 5 is similar to the high-speed driver circuit of FIG. 3, except for control/delay circuit 501. Control/delay circuit 501 comprises an inverter 506 (driven by output terminal OUT) and a level shifter LS. Level shifter LS has an input terminal I driven by inverter 506, a substrate voltage terminal VG driven from outside the driver circuit, and two output terminals Y and Y_B. Level shifter output terminal Y (CTL) is coupled to the gate of N-channel transistor 321. Level shifter output terminal Y_B (CTLB) is coupled to the gates of N-channel transistor 311, pullup 212, and pulldown 222.

Second Embodiment

Figure 6:
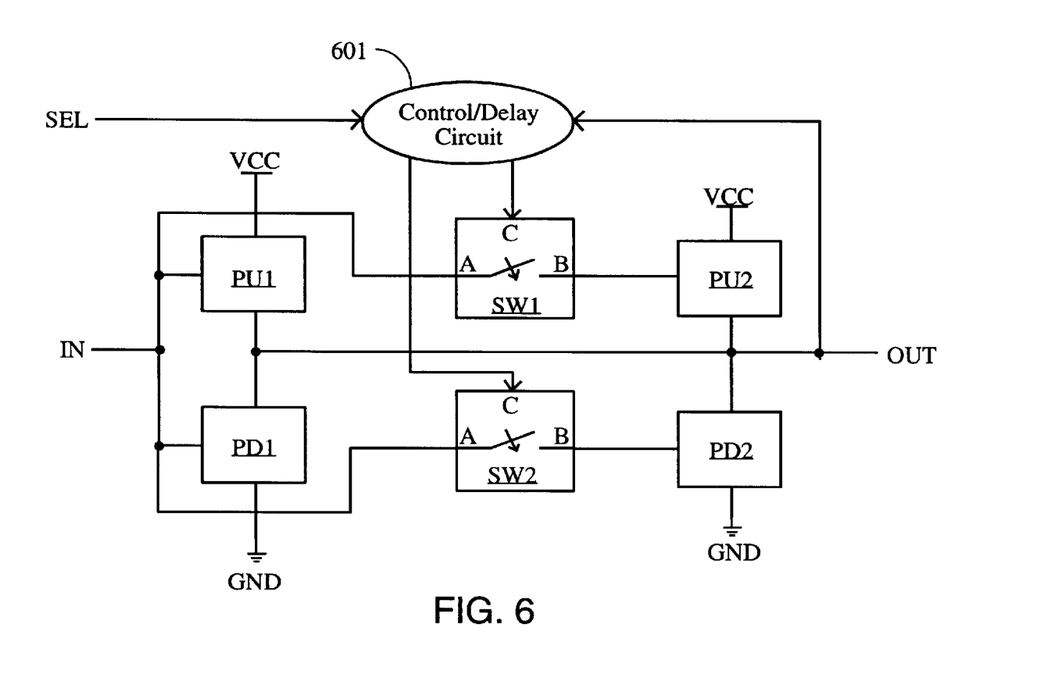
FIG. 6 shows a circuit block diagram for an IC driver circuit according to another embodiment of the invention.

FIG. 6 shows a programmable driver circuit according to a second embodiment of the present invention. The circuit of FIG. 6 is similar to the driver circuit of FIG. 1, except that control circuit 101 and delay element 102 are combined into a single control/delay circuit 601 having a select input terminal SEL controlled from outside the driver circuit. (In some embodiments of the programmable driver circuit, the control and delay circuits are separately implemented, as in FIG. 1. In other embodiments, such as in FPGAs, the control signal is stored in a memory element associated with the driver circuit. In yet other embodiments, more than one select signal is provided to the control circuit.) Control/delay circuit 601 controls switches SW1 and SW2 to implement either a high-speed driver circuit or a noise-insensitive driver circuit according to the logic state of the select input signal on input terminal SEL ("select signal SEL").

Figure 7:
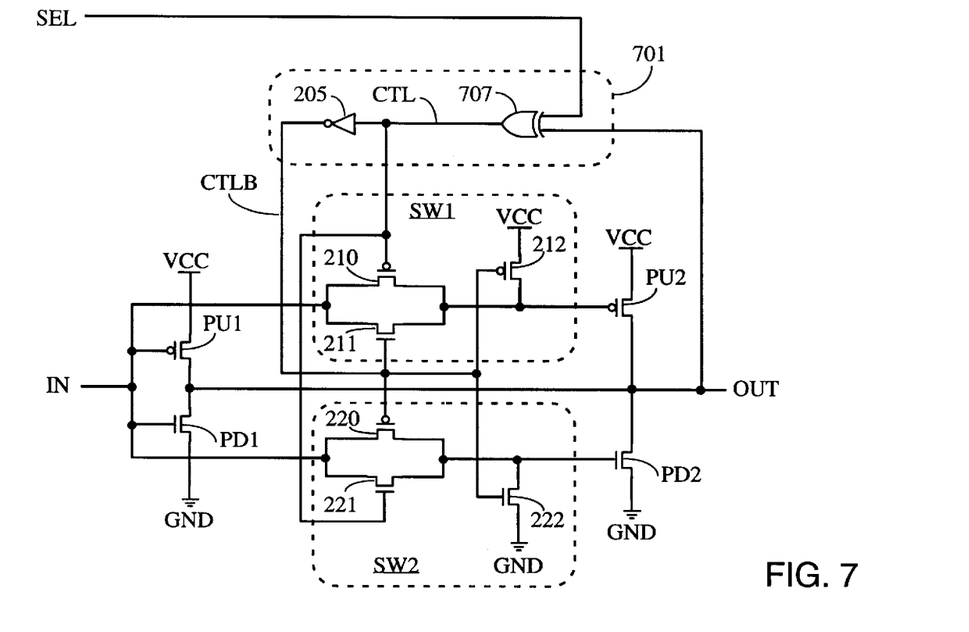
FIG. 7 shows a schematic diagram of a selectably high-speed or noise-insensitive IC driver circuit with CMOS switches implementing the circuit of FIG. 6.

FIG. 7 shows a first implementation of the programmable driver circuit of FIG. 6. The circuit of FIG. 7 is similar to the high-speed driver circuit of FIG. 2, except that control/delay circuit 701 replaces delay element 102 of FIG. 2 by an exclusive-OR (XOR) gate 707 driven by select input terminal SEL and output terminal OUT. XOR gate 707 both implements the select function and introduces the necessary delay into the feedback path from output terminal OUT. When select signal SEL is logic low, the programmable driver circuit of FIG. 7 behaves the same as the high-speed driver circuit of FIG. 2. When select signal SEL is logic high, the programmable driver circuit of FIG. 7 behaves the same as the noise-insensitive driver circuit of FIG. 4.

Figure 8:
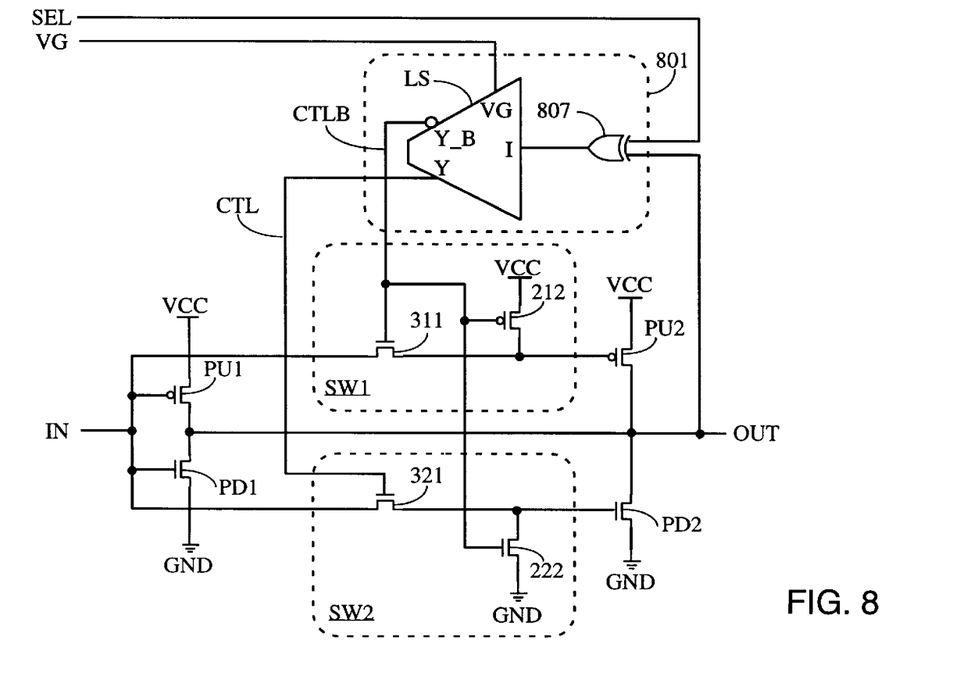
FIG. 8 shows a schematic diagram of a selectably high-speed or noise-insensitive IC driver circuit with NMOS switches implementing the circuit of FIG. 6.

FIG. 8 shows a second implementation of the programmable driver circuit of FIG. 6. The circuit of FIG. 8 is similar to the high-speed driver circuit of FIG. 3, except for control/delay circuit 801. Control/delay circuit 801 includes an XOR gate 807 that drives level shifter LS. XOR gate 807 controls the mode (i.e., high-speed or noise-insensitive) of the programmable driver circuit in a similar manner as XOR gate 707 in FIG. 7. Level shifter output terminal Y_B (CTLB) is coupled to the gates of N-channel transistor 311, pullup 212, and pulldown 222. Level shifter output terminal Y (CTL) is coupled to the gate of N-channel transistor 321.

Note that switches SW1 and SW2 are controlled by inverted outputs of level shifter LS in comparison with the switches of FIG. 3, because inverter 306 is not included in control/delay circuit 801 of FIG. 8.

Third Embodiment

Figure 9:
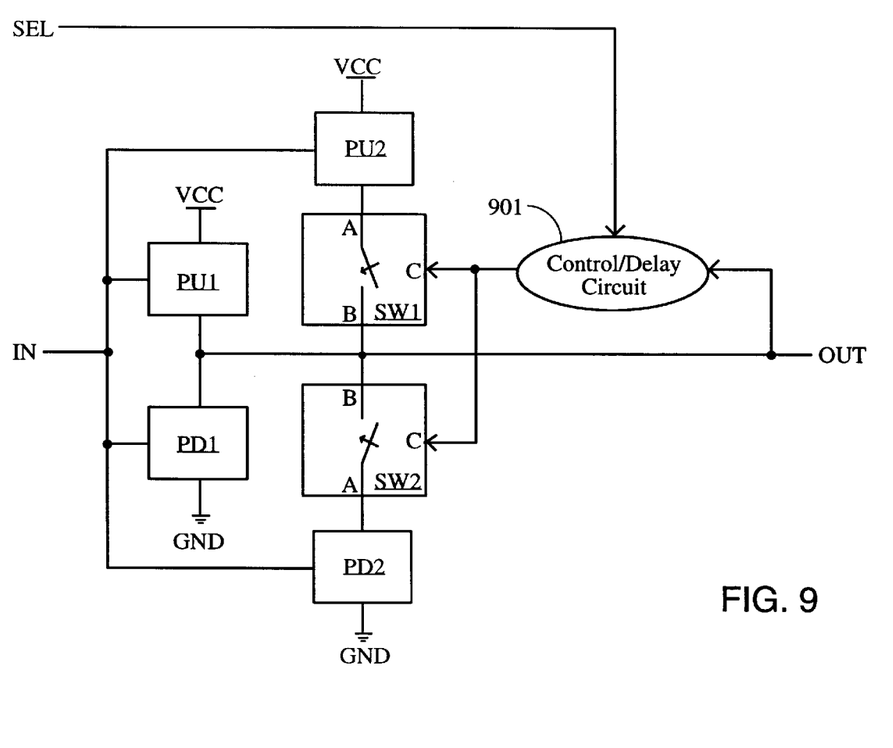
FIG. 9 shows a circuit block diagram for an IC driver circuit according to yet another embodiment of the invention.

FIG. 9 shows a programmable driver circuit according to a third embodiment of the present invention. As in the circuit of FIG. 6, the control circuit and delay element are combined into a single control/delay circuit 901 having a second input terminal SEL controlled from outside the driver circuit. However, in this embodiment switches SW1, SW2 are disposed in series between output terminal OUT and pullup and pulldown circuits PU2, PD2, respectively. In the pictured embodiment, switch circuits SW1, SW2 are positioned next to output terminal OUT. However, in other embodiments, one or both of switch circuits SW1, SW2 are positioned next to the power or ground terminals (VCC, GND) of pullup or pulldown circuits PU2, PD2. Signal IN directly controls the gates of pullup circuit PU2 and pulldown circuit PD2, rather than being routed through the switch circuits. However, in a fashion similar to the circuit of FIG. 6, control/delay circuit 901 controls switches SW1 and SW2 to implement either a high-speed driver circuit or a noise-insensitive driver circuit according to the logic state of select signal SEL.

Figure 10:
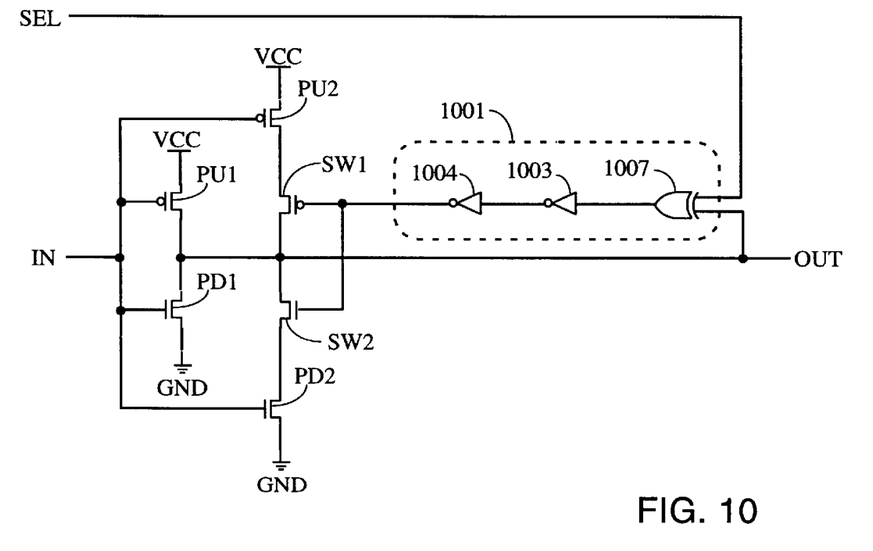
FIG. 10 shows a schematic diagram of a first implementation of the circuit of FIG. 9.

FIG. 10 shows a first implementation of the programmable driver circuit of FIG. 9. In the circuit of FIG. 10, pullup circuits PU1, PU2 are each implemented as a single P-channel transistor. Similarly, pulldown circuits PD1, PD2 are each implemented as a single N-channel transistor. Switch circuit SW1 comprises a P-channel transistor coupled in series with pullup circuit PU2. Switch circuit SW2 comprises an N-channel transistor coupled in series with pulldown circuit PD2. Control/delay circuit 1001 comprises an XOR gate 1007 driven by select input terminal SEL and output terminal OUT, and two inverters 1003, 1004 coupled in series with XOR gate 1007. In the circuit of FIG. 10, inverters 1003, 1004 form a delay element that follows the control circuit (i.e., XOR gate 1007) on the feedback path from output terminal OUT. However, in other embodiments the delay element precedes the control circuit, or the delay is inherent in the control circuit.

Figure 11:
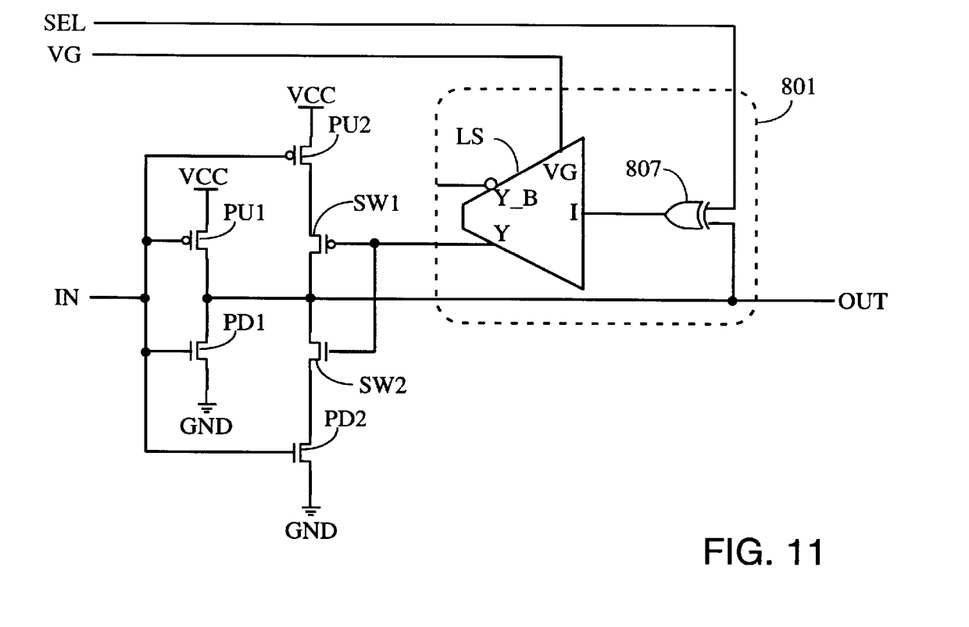
FIG. 11 shows a schematic diagram of a second implementation of the circuit of FIG. 9.

FIG. 11 shows a second implementation of the programmable driver circuit of FIG. 9. The circuit of FIG. 11 is similar to that of FIG. 10, except that control/delay circuit 1001 is replaced by a control/delay circuit 801 comprising an XOR gate 807 and level shifter LS as in FIG. 8. Level shifter output terminal Y is coupled to the gates of the transistors implementing switch circuits SW1, SW2. Level shifter output terminal Y_B is not used in this implementation.

Figure 12:
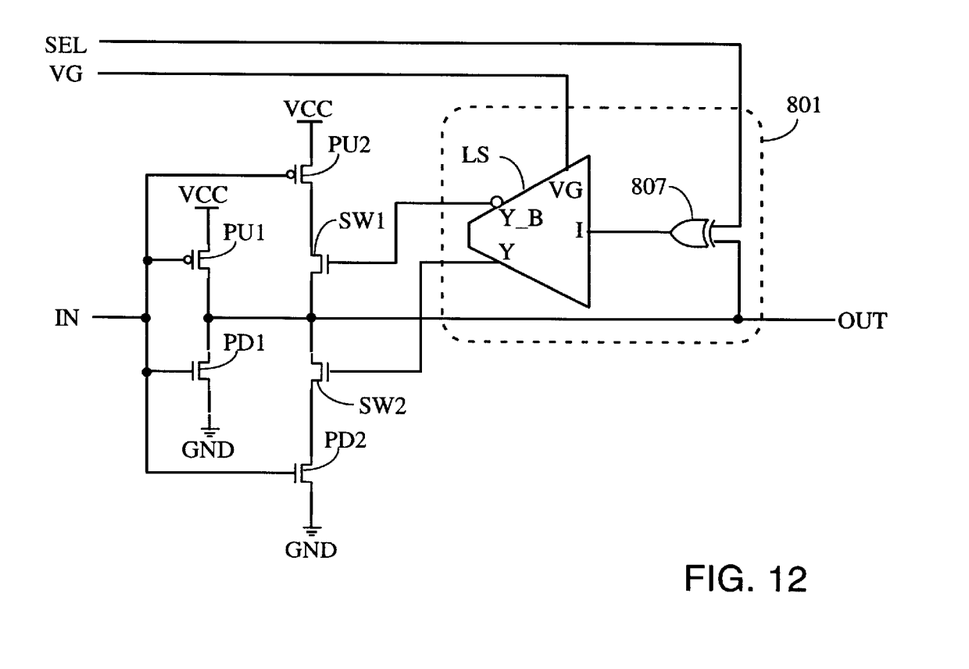
FIG. 12 shows a schematic diagram of a third implementation of the circuit of FIG. 9.

FIG. 12 shows a third implementation of the programmable driver circuit of FIG. 9. The circuit of FIG. 12 is similar to that of FIG. 11, except that switch circuits SW1, SW2 are both implemented as N-channel transistors. Level shifter output terminal Y is coupled to the gate of the N-channel transistor comprising switch circuit SW2. Level shifter output terminal Y_B is coupled to the gate of the N-channel transistor implementing switch circuit SW1.

In another implementation (not shown) of the circuit of FIG. 9, switch circuits SW1, SW2 are each implemented as CMOS pass-gates, i.e., as an N-channel and a P-channel transistor coupled in parallel.

In other embodiments (not shown), only one transition (i.e., low-to-high or high-to-low) triggers a modification of the trip point of the driver circuit, or one transition triggers a modification to high-speed mode while the other transition triggers a modification to noise-insensitive mode.

Those having skill in the relevant arts of the invention will now perceive various modifications and additions that may be made as a result of the disclosure herein. For example, control circuits, delay elements, level shifters, pullup circuits, pulldown circuits, and switch circuits other than those described herein can be used to implement the invention. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. A driver circuit, comprising:
   an input terminal;
   an output terminal;
   a control circuit;
   first and second switch circuits, each having a control terminal coupled to the control circuit;
   first and second pullup circuits coupled between the output terminal and a high power supply voltage, a control terminal of the first pullup circuit being coupled to the input terminal, and a control terminal of the second pullup circuit being coupled to the input terminal through the first switch circuit;
   first and second pulldown circuits coupled between the output terminal and a low power supply voltage, a control terminal of the first pullup circuit being coupled to the input terminal, and a control terminal of the second pullup circuit being coupled to the input terminal through the second switch circuit; and
   a feedback path between the output terminal and the control circuits,
   wherein the control circuit is responsive to a voltage level on the output terminal regardless of a voltage level on the input terminal.

2. The driver circuit of claim 1, wherein the feedback path comprises a delay element.

3. The driver circuit of claim 1, wherein the control circuit lowers a trip point of the driver circuit in response to a voltage level of a signal on the output terminal.

4. The driver circuit of claim 1, wherein the control circuit raises a trip point of the driver circuit in response to a voltage level of a signal on the output terminal.

5. The driver circuit of claim 1, wherein:
   the first switch circuit comprises means for initializing a signal on the control terminal of the second pullup circuit; and
   the second switch circuit comprises means for initializing a signal on the control terminal of the second pulldown circuit.

6. The driver circuit of claim 1, wherein the control circuit comprises:
   means for lowering a trip point of the driver circuit in response to a first voltage level on the output terminal;
   means for raising the trip point of the driver circuit in response to a second voltage level on the output terminal; and
   a control input terminal selecting between raising and lowering the trip point of the driver circuit in response to the first and second voltage levels.

7. A driver circuit, comprising:
   an input terminal;
   an output terminal;
   control circuit;
   first and second switch circuits, each having a control terminal coupled to the control circuit;
   a first pullup circuit coupled between the output terminal and a high power supply voltage, a control terminal of the first pullup circuit being coupled to the input terminal;
   a second pullup circuit coupled in series with the first switch circuit between the output terminal and the high power supply voltage, a control terminal of the second pullup circuit being coupled to the input terminal;
   a first pulldown circuit coupled between the output terminal and a low power supply voltage, a control terminal of the first pulldown circuit being coupled to the input terminal;
   a second pulldown circuit coupled in series with the second switch circuit between the output terminal and a low power supply voltage, a control terminal of the second pullup circuit being coupled to the input terminal; and
   a feedback path between the output terminal and the control circuit.

8. The driver circuit of claim 7, wherein the feedback path comprise a delay element.

9. The driver circuit of claim 7, wherein the control circuit lowers a trip point of the driver circuit in response to a voltage level of a signal on the output terminal.

10. The driver circuit of claim 7, wherein the control circuit raises a trip point of the driver circuit in response to a voltage level of a signal on the output terminal.

11. The driver circuit of claim 7, wherein the control circuit comprises:
    means for lowering a trip point of the driver circuit in response to a first voltage level on the output terminal;
    means for raising the trip point of the driver circuit in response to a second voltage level on the output terminal; and
    a control input terminal selecting between raising and lowering the trip point of the driver circuit in response to the first and second voltage levels.

12. A method for generating an output signal from a driver circuit, the driver circuit having an input terminal receiving an input signal and an output terminal providing the output signal, the driver circuit comprising a pullup circuit and a pulldown circuit, the method comprising:
    detecting a first voltage level on the output terminal;
    setting a trip point of the driver circuit to a lower voltage level when the first voltage level has a first value and to a higher voltage level when the first voltage level has a second value, regardless of a voltage level on the input terminal, the trip point being set by selectively coupling and decoupling the pullup circuit and pulldown circuit to the output terminal;
    detecting a first transition on the input signal; and
    providing a second voltage level on the output terminal in response to the first transition on the input signal.

13. The method of claim 12, wherein in the step of providing a second voltage level on the output terminal, the output signal transitions from the first voltage level to the second voltage level more quickly than the first transition on the input signal.

14. The method of claim 13, wherein the output signal reaches a predetermined voltage level halfway between the first and second values before the input signal reaches the predetermined voltage level.

15. The method of claim 12, wherein the step of setting the trip point of the driver circuit comprises setting the trip point of the driver circuit to a lower voltage level when the first voltage level has a logic high value and to a higher voltage level when the first voltage level has a logic low value.

16. The method of claim 12, wherein the step of setting the trip point of the driver circuit comprises setting the trip point of the driver circuit to a lower voltage level when the first voltage level has a logic low value and to a higher voltage level when the first voltage level has a logic high value.

17. The method of claim 12, wherein the driver circuit is programmable, the method further comprising:
   programming the driver circuit such that the step of setting the trip point of the driver circuit comprises setting the trip point of the driver circuit to a lower voltage level when the first voltage level has a logic high value and to a higher voltage level when the first voltage level has a logic low value.

18. The method of claim 12, wherein the driver circuit is programmable, the method further comprising:
   programming the driver circuit such that the step of setting the trip point of the driver circuit comprises setting the trip point of the driver circuit to a lower voltage level when the first voltage level has a logic low value and to a higher voltage level when the first voltage level has a logic high value.

19. The method of claim 12, wherein:
   the driver circuit further comprises a switch circuit, and the step of setting the trip point of the driver circuit comprises controlling the switch circuit to couple the pullup circuit to the output terminal.

20. The method of claim 12, wherein:
   the driver circuit further comprises a switch circuit, and the step of setting the trip point of the driver circuit comprises controlling the switch circuit to couple the pulldown circuit to the output terminal.

21. The method of claim 12, wherein:
   the driver circuit further comprises a switch circuit, and the step of setting the trip point of the driver circuit comprises controlling the switch circuit to decouple the pullup circuit from the output terminal.

22. The method of claim 12, wherein:
   the driver circuit further comprises a switch circuit, and the step of setting the trip point of the driver circuit comprises controlling the switch circuit to decouple the pulldown circuit from the output terminal.

23. The method of claim 12, the method further comprising:
   detecting the second voltage level on the output terminal;
   setting the trip point of the driver circuit to a lower voltage level when the second voltage level has a first value and to a higher voltage level when the second voltage level has a second value;
   detecting a second transition on the input signal; and
   providing the first voltage level on the output terminal in response to the second transition on the input signal.

24. A programmable driver circuit, comprising:
   an input terminal;
   an output terminal;
   a programmable control circuit having a first mode and a second mode;
   first and second switch circuits, each having a control terminal coupled to the programmable control circuit;
   first and second pullup circuits coupled between the output terminal and a high power supply voltage, a control terminal of the first pullup circuit being coupled to the input terminal, and a control terminal of the second pullup circuit being coupled to the input terminal through the first switch circuit;
   first and second pulldown circuits coupled between the output terminal and a low power supply voltage, a control terminal of the first pullup circuit being coupled to the input terminal, and a control terminal of the second pullup circuit being coupled to the input terminal through the second switch circuit; and
   a feedback path between the output terminal and the programmable control circuit,
   wherein in the first mode the programmable control circuit controls the first and second switch circuits such that the second pullup circuit is enabled and the second pulldown circuit is disabled when a signal on the output terminal is at a first voltage level, and
   wherein in the second mode the programmable control circuit controls the first and second switch circuits such that the second pullup circuit is disabled and the second pulldown circuit is enabled when the signal on the output terminal is at the first voltage level.

25. The programmable driver circuit of claim 24, wherein the feedback path comprises a delay element.

26. The programmable driver circuit of claim 24, wherein
   in the first mode, the control circuit lowers a trip point of the programmable driver circuit in response to a voltage level of a signal on the output terminal; and
   in the second mode, the control circuit raises the trip point of the programmable driver circuit in response to a voltage level of a signal on the output terminal.

27. The programmable driver circuit of claim 24, wherein:
   the first switch circuit comprises means for initializing a signal on the control terminal of the second pullup circuit; and
   the second switch circuit comprises means for initializing a signal on the control terminal of the second pulldown circuit.

28. The programmable driver circuit of claim 24, wherein the programmable control circuit comprises:
   means for lowering a trip point of the driver circuit in response to a first voltage level on the output terminal;
   means for raising the trip point of the driver circuit in response to a second voltage level on the output terminal; and
   a control input terminal selecting between raising and lowering the trip point of the driver circuit in response to the first and second voltage levels.

29. A method for generating an output signal from a programmable driver circuit, the programmable driver circuit having an input terminal receiving an input signal and an output terminal providing the output signal, the method comprising:
   programmably selecting one of a first mode and a second mode for the programmable driver circuit;
   detecting a first voltage level on the output terminal;
   setting a trip point of the programmable driver circuit to a lower voltage level when the first voltage level has a first value and to a higher voltage level when the first voltage level has a second value, the first and second values differing for the first and second modes of the programmable driver circuit;

detecting a first transition on the input signal; and providing a second voltage level on the output terminal in response to the first transition on the input signal.

30. The method of claim 29, wherein setting the trip point of the programmable driver circuit comprises setting the trip point of the programmable driver circuit to a lower voltage level when the first voltage level has a logic high value and to a higher voltage level when the first voltage level has a logic low value.

31. The method of claim 29, wherein setting the trip point of the programmable driver circuit comprises setting the trip point of the programmable driver circuit to a lower voltage level when the first voltage level has a logic low value and to a higher voltage level when the first voltage level has a logic high value.

32. The method of claim 29, wherein programmably selecting one of a first mode and a second mode for the programmable driver circuit comprises:

programming the programmable driver circuit such that the step of setting the trip point of the programmable driver circuit comprises setting the trip point of the programmable driver circuit to a lower voltage level when the first voltage level has a logic high value and to a higher voltage level when the first voltage level has a logic low value.

33. The method of claim 29, wherein programmably selecting one of a first mode and a second mode for the programmable driver circuit comprises:

programming the programmable driver circuit such that the step of setting the trip point of the programmable driver circuit comprises setting the trip point of the programmable driver circuit to a lower voltage level when the first voltage level has a logic low value and to a higher voltage level when the first voltage level has a logic high value.

34. The method of claim 29, wherein:

the programmable driver circuit comprises a pullup circuit and a switch circuit, and the step of setting the trip point of the programmable driver circuit comprises controlling the switch circuit to couple the pullup circuit to the output terminal.

35. The method of claim 29, wherein:

the programmable driver circuit comprises a pulldown circuit and a switch circuit, and the step of setting the trip point of the programmable driver circuit comprises controlling the switch circuit to couple the pulldown circuit to the output terminal.

36. The method of claim 29, wherein:

the programmable driver circuit comprises a pullup circuit and a switch circuit, and the step of setting the trip point of the programmable driver circuit comprises controlling the switch circuit to decouple the pullup circuit from the output terminal.

37. The method of claim 29, wherein:

the programmable driver circuit comprises a pulldown circuit and a switch circuit, and the step of setting the trip point of the programmable driver circuit comprises controlling the switch circuit to decouple the pulldown circuit from the output terminal.

38. The method of claim 29, the method further comprising:

detecting the second voltage level on the output terminal;

setting the trip point of the driver circuit to a lower voltage level when the second voltage level has a first value and to a higher voltage level when the second voltage level has a second value;

detecting a second transition on the input signal; and providing the first voltage level on the output terminal in response to the second transition on the input signal.

* * * * *